United States Patent [19]

Lin

[11] Patent Number: 5,920,091
[45] Date of Patent: Jul. 6, 1999

[54] METHOD OF FABRICATING HIGHLY SENSITIVE PHOTO SENSOR AND STRUCTURE OF THE SAME

[75] Inventor: Chih Hung Lin, Yi-Lan, Taiwan

[73] Assignee: United Microelectronics Corporation, Taipei, Taiwan

[21] Appl. No.: 09/015,448

[22] Filed: Jan. 29, 1998

Related U.S. Application Data

[62] Division of application No. 08/542,696, Oct. 13, 1995, Pat. No. 5,739,065.

[51] Int. Cl.$^6$ .................................................... H01L 29/04
[52] U.S. Cl. .................................... 257/290; 257/458
[58] Field of Search ................................ 257/252, 290, 257/460, 459, 656, 458

[56] References Cited

U.S. PATENT DOCUMENTS

| 5,557,114 | 9/1996 | Leas et al. | 257/290 |
| 5,610,409 | 3/1997 | Leas et al. | 257/290 |

*Primary Examiner*—Donald L. Monin, Jr.
*Attorney, Agent, or Firm*—Baker & Botts, L.L.P.

[57] ABSTRACT

An improved structure of a photo sensor is disclosed. Its structural feature is that a PIN photo diode is allocated in a MOSFET, by means of enlarging the detected small photo current from PIN photo diode by the MOSFET; so as to avoid the shortcoming of conventional PIN photo diode, and enhance the sensitivity of photo sensing.

4 Claims, 2 Drawing Sheets

METHOD OF FABRICATING HIGHLY SENSITIVE PHOTO SENSOR AND STRUCTURE OF THE SAME

This application is a divisional of Ser. No. 08/542,696, filed Oct. 13, 1995, U.S. Pat. No. 5,739,065.

FIELD OF THE INVENTION

The present invention relates to a structure of a highly sensitive photo sensor and its manufacturing method, especially to a structure of forming a MOS (Metal Oxide Semiconductor) element having the above-mentioned function.

BACKGROUND OF THE INVENTION

Usually, PIN (P-type Intrinsic N-type) photo diode is used as a photo sensor, because the thickness of its depletion region (i.e. Intrinsic region) could be modified to get the best quantum efficiency and frequency response.

Refer to FIGS. 1 and 2. FIG. 1 shows the structure of a conventional PIN photo diode, and FIG. 2 shows the energy band diagram of a conventional PIN photo diode. In FIG. 1, an anti-reflection glass layer 10 is used for accepting the incoming light. Most of the incoming light may penetrate it without being reflected. A transparent conducting layer 11 is formed on the anti-reflection glass layer 10. Generally, it's an indium tim oxide layer. Then a P type amorphous silicon, an intrinsic type amorphous silicon layer 13 and an N type layer 12 silicon layer 14 are formed sequentially on the anti-reflection glass layer 10. After that, an aluminum metal contact 15 is formed on the N type amorphous silicon layer 14. When a reverse bias is applied on the device, the intrinsic type amorphous silicon layer 13 is totally depleted. Referring to FIG. 2, electron-hole pairs are generated, and separated by strong electric field when the incident photons are absorbed. These two kinds of carriers cross the depletion region to form photo current. Thus, photo energy is transferred into electrical energy.

However, the deficiency of conventional PIN photo diode is that the generated photo current is generally very small, therefore another amplifier circuit is necessary to enlarge the detected photo current.

SUMMARY OF THE INVENTION

It is therefore an object for the present invention to eliminate the shortcoming of too small photo current of conventional PIN photo diode.

The object of the present invention is fulfilled by disclosing a method for fabricating a highly sensitive photo sensor and its structure, while compared with the prior art, briefly saying, the technical feature of the present invention is that a PIN photo diode is allocated in a MOSFET (Metal Oxide Semiconductor Field Effect Transistor), enlarging the generated photo current from the PIN diode by the MOSFET; thus, the shortcoming of conventional PIN photo diode could be eliminated, and the sensitivity of the photo diode could be further enhanced. The method comprises the following steps of: (a) forming a well region in the substrate; (b) forming a gate oxide layer; (c) depositing a P type polysilicon layer; (d)depositing an intrinsic type amorphous silicon layer; (e)depositing an N type amorphous silicon layer; (f) depositing a transparent conducting layer; (g)depositing and defining a gate photo resist; (h) forming a gate by etching, and removing said gate photo resist; (i) implanting impurities into heavily doped region to form source and drain regions; (j) depositing a dielectric layer; and (k) forming gate sidewall spacers beside said gate by etching said dielectric layer; and (l) forming electrodes of said gate, source and drain regions.

BRIEF DESCRIPTION OF THE DRAWING

The present invention will be more fully understood from the detailed description given hereinafter with reference to and the accompanying drawings which are given by way of illustration only, and thus are not limitative of the present invention and wherein.

DETAILED DESCRIPTION OF THE PREFERRED EMBODIMENT

In order to enhance the sensitivity of the photo diode, an embodiment of the present invention is applied to a semiconductor MOSFET to fabricate a highly sensitive photo sensor according to the present invention as illustrated in FIGS. 3 to 6 and described hereinafter.

Figure 1:
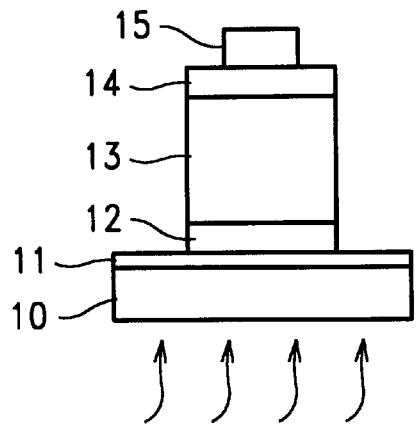
FIG. 1 shows the cross-sectional view of the conventional PIN photo diode.
Figure 2:
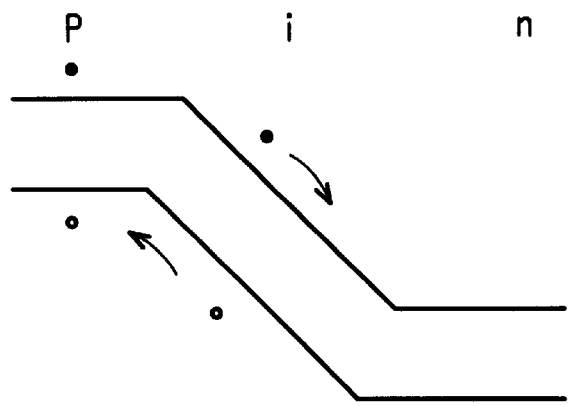
FIG. 2 shows the energy band diagram corresponding to the conventional PIN photo diode.
Figure 3:
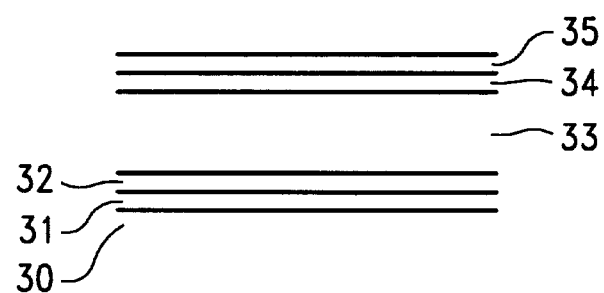
FIGS. 3 to 6 show the cross-sectional views of the highly sensitive photo sensor according to the present invention.

Referring to FIG. 3. The first step is to form a well region 30 in a semiconductor substrate. The second step is to form gate oxides 31 on well region 30. The third step is to deposit a P type polysilicon layer 32 on gate oxides 31. The fourth step is to deposit an intrinsic amorphous silicon layer 33 on P type polysilicon layer 32. The fifth step is to deposit an N type amorphous silicon layer 34 on intrinsic amorphous silicon layer 33. Then, the sixth step is to deposit a transparent conducting layer 35 on N type amorphous silicon layer 34. Usually the transparent conducting layer 35 is an ITO (Indium Tim Oxide) layer, which is made of a transparent conducting material and for the convience of passing light. The reason why it's necessary to deposit an intrinsic type amorphous silicon layer 33 and an N type amorphous silicon layer 34 in the above steps is that the visual light absorption rate of amorphous silicon is even better. Therefore, we could deposit a P type amorphous silicon layer instead of depositing a P type polysilicon layer in the above steps.

Figure 4:
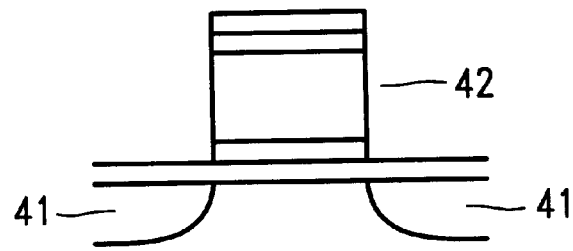

As shown in FIG. 4. The seventh step is to coat photo resist and define its pattern, the photo resist is used to define gate 42. The eighth step is to form a gate by etching, and removing the gate photo resist. The ninth step is to implant heavily doped impurities into heavily doped region 41 to form source and drain regions. The heavily doped impurities could be As(Arsenide) or p(phosphorus), and the gate 42 is basically constructed by a PIN photo diode.

Figure 5:
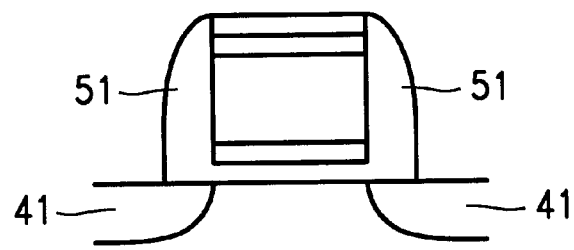

Then referring to FIG. 5. The tenth step is to deposit a dielectric layer; and the eleventh step is to etch the dielectric layer to form the gate side wall spacers 51; the material of the dielectric layer could be silicon dioxide or silicon nitride.

Figure 6:
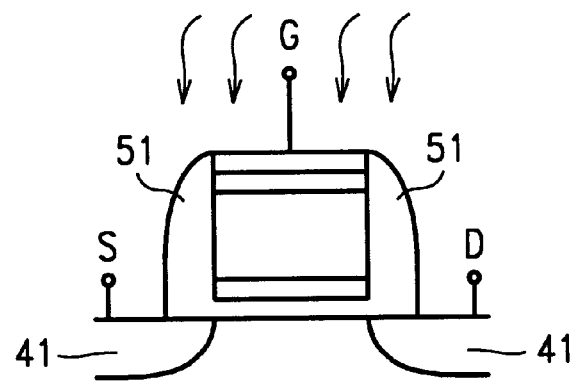

Finally, referring to FIG. 6, The twelfth step is to form the electrodes of gate, source and drain ; the device structure of this invention is shown in FIG. 6.

As stated above, in the present invention, the device structure of a highly sensitive photo sensor comprises a first type well on a semiconductor substrate, and a first heavily doped region, used as the drain of said high sensitivity photo sensor; a second heavily doped region having a predetermined distance with said first heavily doped region, used as the source of said highly sensitive photo sensor; a gate oxide layer on between said first and second heavily doped regions; a photo detection gate on said gate oxide layer; and gate sidewall spacers beside said photo detection gate and said gate oxide layer.

While positive voltage is applied on the gate and drain i.e. Vg>0, Vd>0, and the source and substrate are grounded; PIN photo diode is reverse biased. If there is no incoming light on it, the photo current is nearly zero. And while the light projects on it, the reverse biased PIN photo diode generates electron hole pairs. That's the original excuse of the small photo current. And while the electrons are drifting toward the N type amorphous silicon, flowing away from the gate; the holes are diffusing toward the P type polisilicon or amorphous silicon, and accumulate to raise the electrical potential. If the Electrical potential is beyond the threshold voltage of MOS, then the MOS is turned on and generate greater current.

When the voltage applied on gate is negative, i.e. Vg<0, PIN photo diode is forward biased, the holes trapped in P type polysilicon are absorbed by the gate and are erased. The device would be back to the initial state, which is prepared for the next detection.

It should be noted that the present invention can be applied to either a P type substrate or an N type substrate since the interchange of P type and N type is well known to those persons skilled in the art, it is not further discussed hereinafter.

To summarize the description, the feature arid creation point of present invention is that a PIN photo diode is allocated in a MOSFET, enlarging the detected small photo current from PIN photo diode by the MOSFET; thus, the shortcoming of conventional PIN photo diode could be eliminated, the sensitivity of photo sensing could be further enhanced.

While the invention has been described by way of examples and in terms of several preferred embodiments, it is to be understood that the invention need not be limited to the disclosed embodiment. On the contrary, it is intended to cover various modifications and similar arrangements included within the spirit and scope of the appended claims, the scope of which should be accorded the broadest interpretation so as to encompass all such modifications and similar structures.

What is claimed is:

1. A structure of a photo sensor comprising:

a semiconducter substrate having a source and a drain;

a gate oxide layer on said substrate and between said source and said drain;

a p-type polysilicon layer on said gate oxide layer;

a gate comprising:

an intrinsic amorphous silicon layer on said P-type polysilicon layer, an N-type amorphous silicon layer on said intrinsic amorphous silicon layer;

a transparent conducting layer on said N type amorphous silicon layer;

gate sidewall spacers beside said gate adjacent to said source and said drain; and a plurality of electrodes each formed on said gate, said source, and said drain.

2. A photo sensor according to claim 1 wherein said transparent conducting layer comprises indium tin oxide.

3. A photo sensor according to claim 1, wherein said sidewall spacers are formed by depositing silicon dioxide.

4. A photo sensor according to claim 1, wherein said sidewall spacers are formed by depositing silicon nitride.

* * * * *

UNITED STATES PATENT AND TRADEMARK OFFICE
CERTIFICATE OF CORRECTION

PATENT NO. : 5,920,091
DATED : July 6, 1999
INVENTOR(S) : Chih-Hung Lin

It is certified that error appears in the above-indentified patent and that said Letters Patent is hereby corrected as shown below:

Title Page, ITem [54]: "METHOD OF FABRICATING HIGHLY SENSITIVE PHOTO SENSOR AND STRUCTURE OF THE SAME" should read --STRUCTURE OF A PHOTO SENSOR--;

Item [75], Inventor: "Chih Hung Lin" should read -- Chih-Hung Lin--;

Column 1, line 1, "METHOD OF FABRICATING HIGHLY SENSITIVE PHOTO SENSOR AND STRUCTURE OF THE SAME" should read -- STRUCTURE OF A PHOTO SENSOR--;

Column 2, line 52, "As(Arsenide) or p(phosphorus)," should read -- As (Arsenic) or p (phosphorus), --;

Column 4, line 16, "p-type" should read -- P-type --;

Column 4, line 22, "N type" should read -- N-type --.

Signed and Sealed this

Tenth Day of April, 2001

Attest:

NICHOLAS P. GODICI

*Attesting Officer*  *Acting Director of the United States Patent and Trademark Office*